(12) United States Patent
De Jong et al.

(10) Patent No.: US 6,800,813 B2
(45) Date of Patent: *Oct. 5, 2004

(54) SWITCH FOR POWER TOOLS WITH INTEGRATED SWITCH CONTACTS

(75) Inventors: Martinus W. A. De Jong, Vught (NL); Robertus J. M. Van Turnhout, Best (NL); Josephus A. Van Gerwen, Eersel (NL)

(73) Assignee: Capax B.V. (NL)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 331 days.

(21) Appl. No.: 09/301,264

(22) Filed: Apr. 29, 1999

(65) Prior Publication Data

US 2002/0157858 A1 Oct. 31, 2002

(30) Foreign Application Priority Data

Apr. 29, 1998 (NL) .............................................. 1009036

(51) Int. Cl.[7] .................................................. H05K 1/00
(52) U.S. Cl. ...................................... 174/250; 174/261
(58) Field of Search ................................ 174/261, 260; 361/768, 781; 200/11 C, 110 A

(56) References Cited

U.S. PATENT DOCUMENTS

| | | | | |
|---|---|---|---|---|
| 3,689,684 A | * | 9/1972 | Cox, Jr. et al. ............. | 174/260 |
| 4,578,547 A | * | 3/1986 | Gunther et al. ........... | 200/110 A |
| 5,016,086 A | * | 5/1991 | Inoue et al. ................... | 357/74 |
| 5,291,179 A | * | 3/1994 | Ooe et al. .................... | 338/307 |
| 5,308,928 A | * | 5/1994 | Parla et al. .................. | 174/261 |
| 5,598,967 A | * | 2/1997 | Greenwood et al. ......... | 228/174 |
| 5,729,437 A | * | 3/1998 | Hashimoto ................... | 361/760 |

* cited by examiner

Primary Examiner—Kamand Cuneo
Assistant Examiner—Tuan Dinh
(74) Attorney, Agent, or Firm—Banner & Witcoff, Ltd.

(57) ABSTRACT

A hybrid printed circuit carrier including a ceramic carrier, traces applied on the carrier, circuit components located on said carrier and a plurality of switch contacts. The switch contacts form a portion of a movable switch and are fixedly applied on the same surface of the carrier as the traces and the circuit components. The application of at least a portion of the fixed contacts of the moving switch allows these contacts to be located on the carrier in the same process step as the location of the other components to be located on the carrier. This application can be executed easily using a pick-and-place apparatus, thereby avoiding labor-intensive manual processing. Also, contact elements for a plug connection with wires can be applied on the carrier. The location of the contact elements onto said carriers obviates the need for screw connections, etcetera for making electrical connections with the switch unit, which are classically formed by wires.

11 Claims, 1 Drawing Sheet

Figure 1:
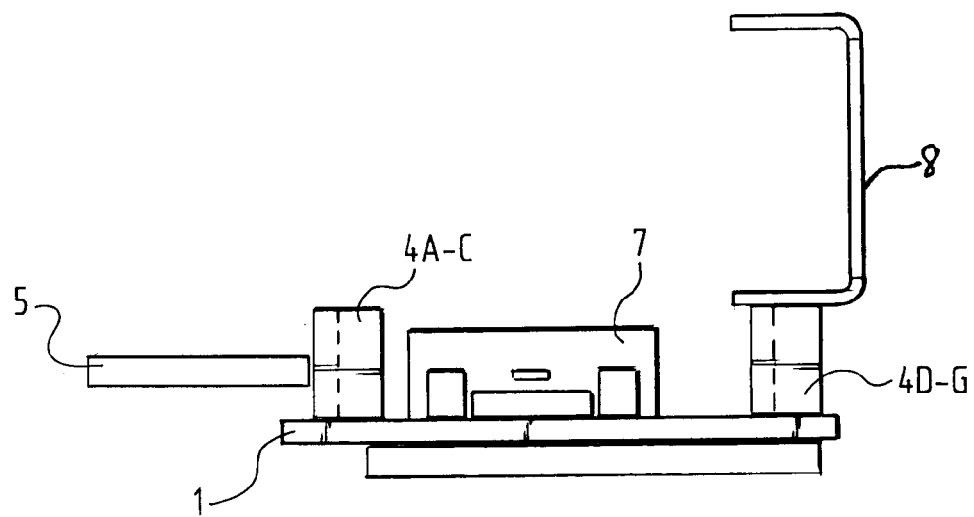

U.S. Patent    Oct. 5, 2004    US 6,800,813 B2

SWITCH FOR POWER TOOLS WITH INTEGRATED SWITCH CONTACTS

BACKGROUND OF THE INVENTION

The present invention relates generally to the field of switches, and in particular, but not exclusively to switches for power tools. In this field it is known to use printed circuit carriers of the hybrid type, comprising a ceramic carrier, traces applied on said carrier and circuit components located on said carrier.

During the assembly of such switch units these carriers have to be located into the housing of the switch unit, after which the contacts for the switches have to be inserted, and finally the moving parts of the switch. This involves labour-intensive and thus costly processing.

BRIEF SUMMARY OF THE INVENTION

The aim of the invention is to provide such a switch, and in particular a printed circuit carrier fit for use in said switch, wherein the assembly of a switch unit can be automated, for instance through the use of pick and place apparatuses.

This aim is reached in that fixed contacts belonging to a switch are applied on the circuit carrier.

The application of at least a part of the fixed contacts of the switch allow these contacts to be located on the carrier in the same process as the location of the other components to be located on the carrier, which can easily be executed through a pick-and-place apparatus.

This avoids labour-intensive manual processing.

According to a first embodiment the fixed contacts of the switch are soldered or brazed onto the carrier. This allows the use of the same soldering process, as is used of soldering the other components onto the carrier. It thus eliminates another processing step.

According to another preferred embodiment contact elements for a plug connection with wires are applied on the carrier.

The location of those contact elements onto said carriers obviates the need for screw connections, etcetera for making electrical connections with the switch unit, which classicly are formed by wires.

By using a plug connection with the wires the extra handling of the labour for screw connections are obviated, also eliminating an internal connection between the carrier in the housing of the switch unit, in which usually the screw connection elements have been provided.

Preferably, the contact elements have been brazed or soldered onto said carrier.

This offers the same advantages, as the soldering or brazing of the fixed contacts.

According to another prefered embodiment the contact elements and the contacts have the same shape.

This allows substantial savings in stock-keeping, etcetera.

According to another prefered embodiment the contacts are composed of a U-shaped profile of copper containing metal.

The use of this shape allows the multi-functionality of fixed contacts of a switch and of the contact pieces for plug connection by the same pieces. Further, the use of a copper containing metal combines the advantages of the low-electrical resistance of copper with other desirable quantities provided by another free selectable material.

According to yet another prefered embodiment the contact locations of the contacts are covered with a layer of a precious metal.

Other prefered embodiments appear from the other sub-claims.

BRIEF DESCRIPTION OF THE INVENTION

Subsequently, the present invention will be elucidated with the help of the accompanying drawings, in which:

FIG. 1 shows a carrier 1 made of for instance ceramic material. Ceramic material is used to allow higher temperatures in the components mounted on said carriers; otherwise, plastics would suffice.

DETAILED DESCRIPTION OF THE INVENTION

Figure 2:
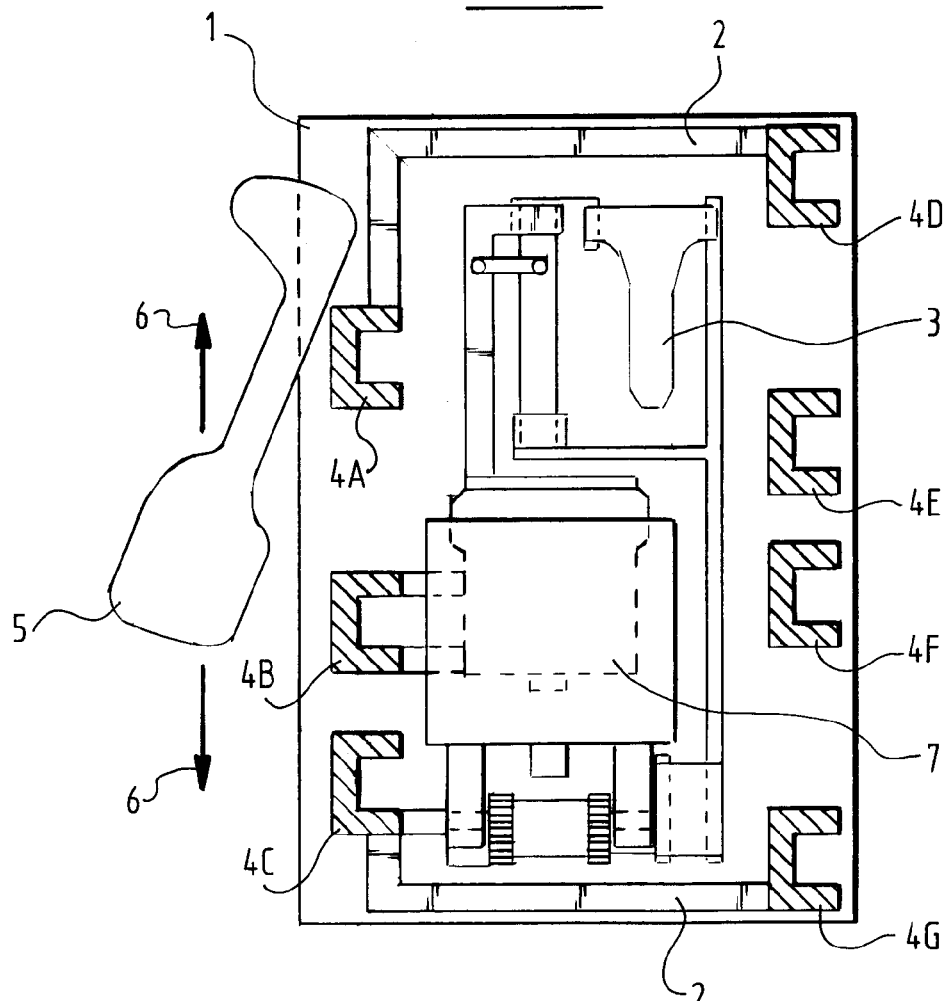

As shown in FIG. 2, traces 2 of copper have been printed, for instance by means of screen printing onto the carrier 1. These traces form the connections between the components mounted on said carrier, as is well known in prior art.

Further, a trace 3 made of a carbon composition has been printed onto the carrier 1, which serves as a potentiometer.

Further, fixed contacts 4A–C formed by U-shaped profile members have been provided on the carrier. They are formed from profiled metal, in particular copper containing metal, and they are soldered onto the carrier, in particular on traces 2.

Further, not forming part of the carrier, is a slider 5 made of electrically conducting material and being movable in the directions of the arrows 6. This implies that the slider 5 can contact each of the fixed contacts 4A,4B or 4C, making the necessary switch connections.

In the case of an electric power tool these functions are switching on and off of the tool, in particular the electric motor thereof, while the other switch function is the by-passing of the electronic circuit, which provides for the power control of the electric motor. Close to the upper limit of the power control range the electric power unit is by-passed to avoids losses in the power control unit.

The slider is also visible in FIG. 1. The slider 5 is connected to the trigger unit, movable by the user of the electric power tool.

Further, on the other side of the carrier 1 another series of contacts 4D, 4E, 4F and 4G has been provided, which are also fixed on the carrier in the same way as the other mentioned contacts 4A–4C.

The contacts 4D–4G have, however, an other function; they serve as the fixed parts of plug connections 8, so that special adapted plugs can be used for making wire connections to the circuits provided on the carrier.

This feature leads to the advantage of an easy plug connection, which is per se labour saving and the logistics savings of having only one part serving both as connector and as fixed contact for a switch.

What is claimed is:

1. A power control unit for a power tool, said power control unit comprising a ceramic carrier, traces applied on said carrier, circuit components located on said carrier, contact elements for performing a first function, each said contact element being configured for receiving a plug connection with wires and being removably secured to an upper surface of a respective one of said traces, and a plurality of fixed contacts for performing a second function that is different from said first function, each said fixed contact being removably secured to an upper surface of a respective one of said traces, wherein said fixed contacts form a portion of a switch and are applied on said carrier.

2. A power control unit for a power tool as claimed in claim 1, wherein the fixed contacts comprise elements soldered or brazed onto the respective one of the traces.

3. A power control unit for a power tool as claimed in claim 1, wherein the contact elements are brazed or soldered onto the respective one of the traces.

4. A power control unit for a power tool as claimed in claim 1, wherein the contacts include a U-shaped profile and are comprised of a copper containing metal.

5. A power control unit for a power tool as claimed in claim 1 wherein said switch is a moving switch.

6. A power control unit for a power tool as claimed in claim 1 wherein said carrier includes first and second outer surfaces on opposite sides of said carrier, and wherein each said fixed contact is applied on the first outer surface of the respective one of the carrier.

7. A power control unit for a power tool as claimed in claim 3, wherein the contacts and the contact elements have the same shape.

8. A power control unit for a power tool as claimed in claim 4, wherein a contact location of each contact is covered with a layer of a precious metal.

9. Method for producing a circuit carrier comprising a ceramic carrier, traces applied on said ceramic carrier, circuit components located on said ceramic carrier, and a plurality of fixed contacts, wherein said fixed contacts form a portion of a switch and are applied on said ceramic carrier, said method comprising a step of locating the contacts on the ceramic carrier and, during said step, also locating the components on the ceramic carrier.

10. A power control unit for a power tool as claimed in claim 7, wherein the contacts include a U-shaped profile and are comprised of a copper containing metal.

11. A power control unit for a power tool as claimed in claim 5 wherein said switch includes a slider.

* * * * *